(12) United States Patent
Sheu et al.

(10) Patent No.: US 8,704,264 B2
(45) Date of Patent: Apr. 22, 2014

(54) LIGHT EMITTING DIODE PACKAGE STRUCTURE

(75) Inventors: Sheng-Jia Sheu, Taipei (TW);
Chih-Hung Hsu, Taipei (TW);
Chung-Chuan Hsieh, Taipei (TW)

(73) Assignee: Everlight Electronics Co., Ltd. (TW)

( * ) Notice: Subject to any disclaimer, the term of this patent is extended or adjusted under 35 U.S.C. 154(b) by 170 days.

(21) Appl. No.: 12/637,765

(22) Filed: Dec. 15, 2009

(65) Prior Publication Data
US 2010/0148211 A1 Jun. 17, 2010

(30) Foreign Application Priority Data

Dec. 15, 2008 (TW) ............... 97222510 U
Oct. 23, 2009 (TW) ............... 98135965 A

(51) Int. Cl.
*H01L 33/48* (2010.01)
*H01L 33/62* (2010.01)

(52) U.S. Cl.
USPC .................. 257/99; 257/E33.058

(58) Field of Classification Search
USPC ................................. 257/E33.058
See application file for complete search history.

(56) References Cited

U.S. PATENT DOCUMENTS

| | | | |
|---|---|---|---|
| 2007/0034889 A1* | 2/2007 | Waitl et al. ...................... | 257/99 |
| 2009/0057708 A1 | 3/2009 | Abdul Karim et al. | |
| 2010/0096642 A1* | 4/2010 | Chang et al. .................... | 257/88 |

FOREIGN PATENT DOCUMENTS

| | | |
|---|---|---|
| CN | 201104323 Y | 8/2008 |
| CN | 101420007 A | 4/2009 |
| JP | 2002-374005 | 12/2002 |
| JP | 2008-140944 | 6/2008 |
| JP | 2008-244151 | 10/2008 |
| KR | 100748241 | 8/2007 |
| TW | 200931691 | 7/2009 |
| TW | M368898 | 11/2009 |

\* cited by examiner

*Primary Examiner* — Ha Tran T Nguyen
*Assistant Examiner* — Raj R Gupta
(74) *Attorney, Agent, or Firm* — Han IP Corporation

(57) ABSTRACT

A light emitting diode (LED) package structure including a leadframe, a housing, a LED chip and a light-transmissive encapsulant is provided. The leadframe has a first electrode and a second electrode separated from each other. The housing wraps the first electrode and the second electrode and includes a recess having a bottom and a sidewall. The bottom of the recess has a cover layer covering the leadframe and having an opening exposing an end of the first electrode, an end of the second electrode and a spacer disposed therebetween and connected thereto wherein the spacer, the end of the first electrode and the end of the second electrode are substantially coplanar. The LED chip is disposed in the recess and electrically connected to leadframe. The light-transmissive encapsulant is filled in the recess.

17 Claims, 4 Drawing Sheets

LIGHT EMITTING DIODE PACKAGE STRUCTURE

CROSS-REFERENCE TO RELATED APPLICATION

This application claims the priority benefit of Taiwan applications serial no. 97222510 and 98135965, filed on Dec. 15, 2008 and Oct. 23, 2009. The entirety of each of the above-mentioned patent applications is hereby incorporated by reference herein and made a part of this specification.

BACKGROUND OF THE INVENTION

1. Field of the Invention

The present invention generally relates to a package structure, and particularly to a light-emitting diode package structure.

2. Description of Related Art

The light-emitting diode has the advantages including low power consumption, long device lifetime, no idling time and fast response speed. Besides, the LED has the features of small dimension, great resistance to vibration, capability for mass production and easily to be adapted to the ultra-small or array device under demand so that the LED is widely used on the indicator or display device of the information appliance, the telecommunication appliance and the consumptive electronic appliances and has become indispensable electronic gadgets in our daily life.

The LED chip should be packed before being used. Besides enhancing the light extraction efficiency, the current package technology focuses on decreasing the thermal stress of the package structure to increase the lifetime and the reliability of the package structure.

FIG. 1 is a schematic cross-sectional view showing a conventional LED package structure. As shown in FIG. 1, the conventional LED package structure 100 has a leadframe 110, a LED chip 120, a wire 130, a housing 140 and an encapsulant 150, wherein the housing 140 wraps the leadframe 110 and has a recess R. The bottom of the recess R has two openings 142 and 144 exposing a portion of the leadframe 110, wherein the housing 140 possesses a spacer 146 for separating the openings 142 and 144 apart and the spacer 146 protrudes from the leadframe 110 at a surface 112 facing toward the recess R. The LED chip 120 is disposed on the surface 112 of the leadframe 110 in the opening 142 and the wire 130 is connected the LED chip 120 with the leadframe 110 exposed by the opening 144. The molding compound 150 is disposed in the recess R to cover the LED chip 120 and the wire 130.

During the wire bonding process, the wire 130 is connected to the LED chip 120 by the bonding tip B, and then the bonding tip B pulls the wire 130 and moves along a wire bonding path A so as to connect the wire 130 to the leadframe 110 exposed by the opening 144. However, during the movement of the bonding tip B, it is easy for the bonding tip B to hit the spacer 146 protruding from the surface 112, which leads to the bonding failure. Therefore, the design of the housing 140 leads to the raising of the difficulty of the wire bonding and the increasing of the fabricating cost.

SUMMARY OF THE INVENTION

The present invention provides an LED package structure capable of increasing the yield of the bonding process.

The present invention provides a light-emitting diode (LED) package structure comprises a lead frame, a housing, an LED chip and a light-transmissive encapsulant. The leadframe has a first electrode and a second electrode separated from each other. The first electrode and the second electrode are configured in the housing and the housing includes a recess having a bottom and a sidewall. The bottom of the recess has a cover layer covering the leadframe and has an opening exposing a first end of the first electrode, a first end of the second electrode and a spacer disposed between the first end of the first electrode and the first end of the second electrode and connected the first end of the first electrode to the first end of the second electrode. The spacer, the first end of the first electrode and the first end of the second electrode are substantially coplanar. The light emitting diode chip is, configured in the recess, wherein the light emitting diode chip is electrically connected to the leadframe. The light-transmissive encapsulant fills the recess.

In one embodiment of the present invention, a second end of the first electrode and a second end of the second electrode respectively outwardly extend from an inner surface of the housing toward a bottom surface of an outer surface of the housing.

In one embodiment of the present invention, the light emitting diode chip is configured on the first end of the first electrode exposed by the opening.

In one embodiment of the present invention, the light emitting diode chip is electrically connected to the leadframe through a first wire.

In one embodiment of the present invention, the light emitting diode chip is electrically connected to the leadframe through a second wire, and the first wire and the second wire are configured on the same side of the light emitting diode chip.

In one embodiment of the present invention, the light emitting diode package structure further comprises a heat sink, wherein a first end of the heat sink is exposed by the opening and the light emitting diode chip is configured on the first end of the heat sink, and a second end of the heat sink outwardly extends from an inner surface of the housing to an outer surface of the housing.

In one embodiment of the present invention, the light emitting diode chip is electrically connected to the leadframe through two wires.

In one embodiment of the present invention, the opening further comprises an extension portion, and the extension portion exposes the first end of the heat sink and the light emitting diode chip configured on the first end of heat sink.

The present invention provides a light-emitting diode (LED) package structure comprises a lead frame, a housing, an LED chip and a light-transmissive encapsulant. The leadframe has a first electrode and a second electrode separated from each other. The first electrode and the second electrode are configured in the housing and the housing includes a recess having a bottom and a sidewall, and the bottom of the recess has a cover layer covering the leadframe and has an opening exposing a first end of the first electrode and a first end of the second electrode. The light emitting diode chip is configured in the opening, wherein the light emitting diode chip is electrically connected to an electrical connecting point of the second electrode through a first wire, and there is a flat plane between the electrical connecting point and the light emitting diode chip. The light-transmissive encapsulant fills the recess.

In one embodiment of the present invention, a second end of the first electrode and a second end of the second electrode respectively outwardly extend from an inner surface of the housing toward a bottom surface of an outer surface of the housing.

In one embodiment of the present invention, the flat plane comprises the first end of the first electrode, the first end of the second electrode and at least a spacer.

In one embodiment of the present invention, the spacer is configured between the first end of the first electrode and the first end of the second electrode, and the spacer is connected to the first end of the first electrode and the first end of the second electrode.

In one embodiment of the present invention, the light emitting diode chip is electrically connected to the first end of the first electrode through a second wire.

In one embodiment of the present invention, the light emitting diode package structure further comprises a heat sink, wherein a first end of the heat sink is exposed by the opening and the light emitting diode chip is configured on the first end of the heat sink, and a second end of the heat sink outwardly extends from an inner surface of the housing to an outer surface of the housing.

In one embodiment of the present invention, the light emitting diode chip is electrically connected to an electrical connecting point of the first end of the first electrode and the electrical connecting point of the first end of the second electrode through two wires respectively.

In one embodiment of the present invention, the flat plane comprises the first end of the heat sink, the first end of the first electrode, the first end of the second electrode and a plurality of spacers.

In one embodiment of the present invention, the spacers are configured between the first end of the heat sink and the first end of the first electrode and between the first end of the heat sink and the first end of the second electrode respectively.

Accordingly, the spacer of the housing of the present invention is coplanar with one end of the first electrode and one end of the second electrode so that the bonding tip can be prevented from hitting the spacer during the wire bonding process. Thus, the yield of the bonding process can be improved and the fabricating cost can be decreased.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
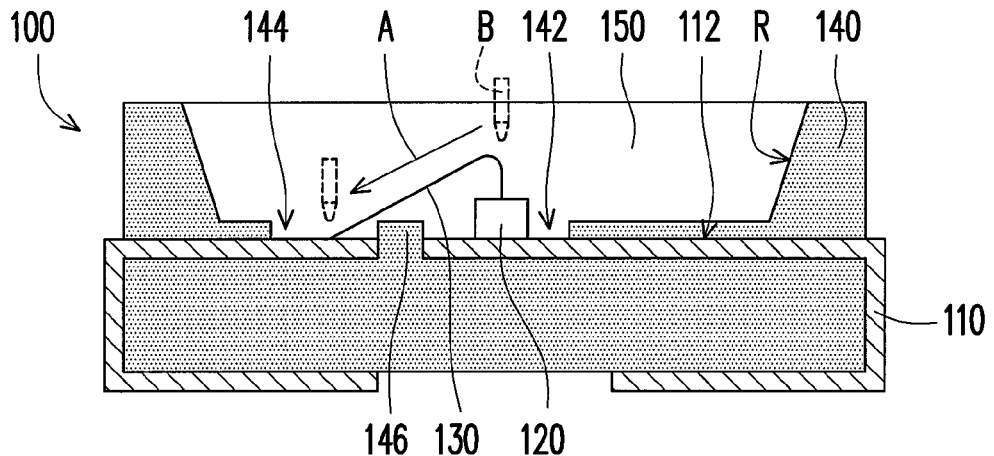
FIG. 1 is a schematic cross-sectional view showing a conventional LED package structure.
Figure 2A:
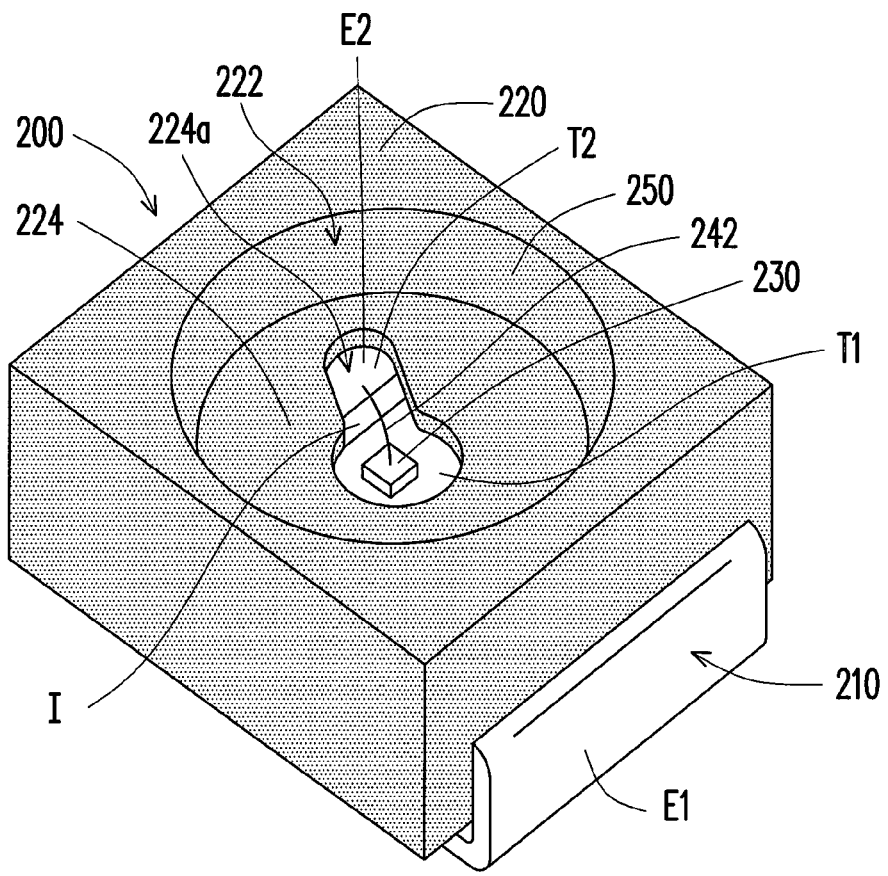
FIG. 2A is a schematic view illustrating an LED package structure according to one embodiment of the present invention.
Figure 2B:
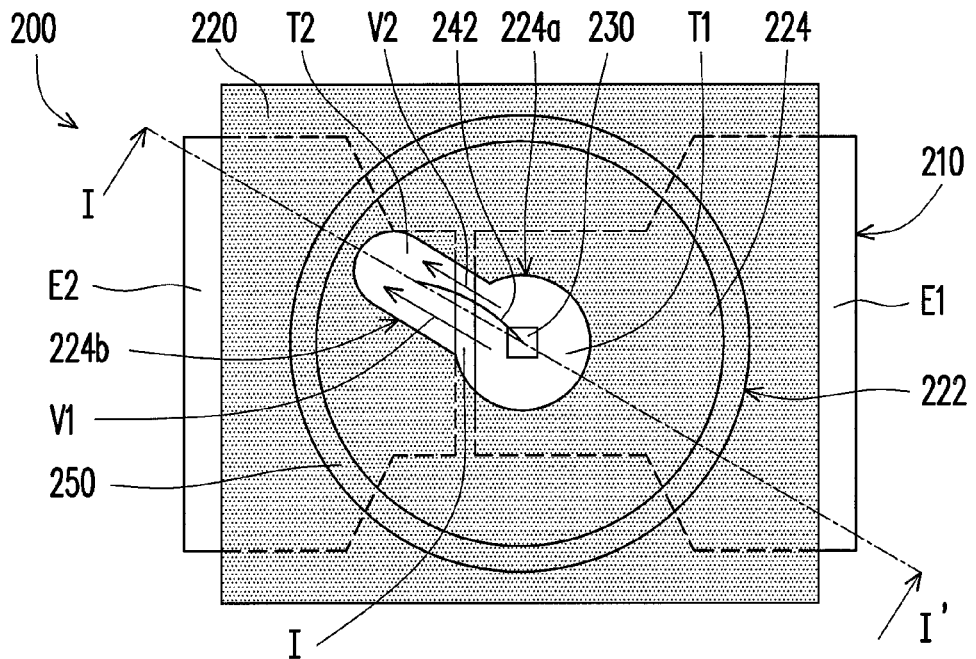
FIG. 2B is a schematic top view of the LED package structure in FIG. 2A
Figure 2C:
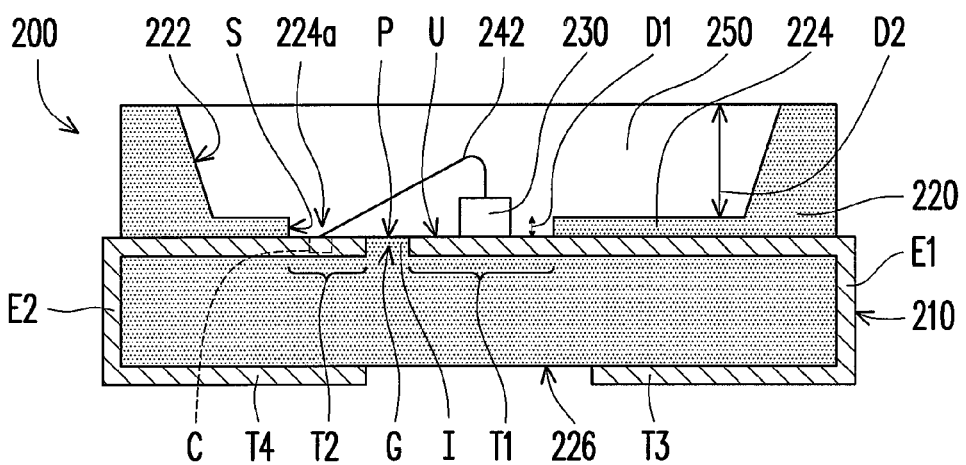
FIG. 2C is a schematic cross-sectional view along line I-I' of the LED package structure in FIG. 2B.

FIG. 2A is a schematic view illustrating an LED package structure according to one embodiment of the present invention, FIG. 2B is a schematic top view of the LED package structure in FIG. 2A and FIG. 2C is a schematic cross-sectional view along line I-I' of the LED package structure in FIG. 2B.

As shown in FIG. 2A together with FIG. 2B and FIG. 2C, a light emitting diode (LED) package structure 200 comprises a lead frame 210, a housing 220, an LED chip 230, a first wire 242 and a light-transmissive encapsulant 250. The leadframe 210 has a first electrode E1 and a second electrode E2 separated from each other.

The housing 220 wraps a portion of the leadframe 210. In other words, the portion of the leadframe 210 is configured in the housing 220. Specifically, in the present embodiment, a third end T3 of the first electrode E1 and a fourth end T4 of the second electrode E2 respectively outwardly extend from an inner surface of the housing 220 toward a bottom surface 226 of an outer surface of the housing 220. The housing 220 has a spacer I configured between a first end T1 of the first electrode E1 and a second end T2 of the second electrode E2, and the spacer I is connected to the first end T1 of the first electrode E1 and the second end T2 of the second electrode E2. Further, the spacer I, the first end T1 of the first electrode E1 and the second end T2 of the second electrode E2 are substantially coplanar. In other words, a flat plane P comprises the spacer I, the first end T1 of the first electrode E1 and the second end T2 of the second electrode E2.

The housing 220 has a recess 222 having a bottom and a sidewall. The bottom of the recess 222 has a cover layer 224 covering the leadframe 210 and having an opening 224a. The opening 224a exposes the first end T1 of the first electrode E1, the second end T2 of the second electrode E2 and the spacer I. Specifically, the first end T1 of the first electrode E1 is separated from the second end T2 of the second electrode E2 by a gap G, and the spacer I fills the gap G, and the opening 224a is configured above the gap G. The material of the housing 220 can be, for example, polymer material.

In the present embodiment, the opening 224a has an extension portion 224b extending from the periphery of the opening 224a, and the extension portion 224b exposes the second end T2 of the second electrode E2. Furthermore, the extension portion 224b is substantially a strip opening and the extension portion 224b extends along a direction V1 substantially parallel to a wire bonding direction V2 of the first wire 242. The depth D1 of the opening 224a can be smaller than the depth D2 of the recess 222, and the sidewall S of the opening 224a circles the LED chip 230 and the first wire 242.

The LED chip 230 is configured in the recess 222 and on the first end T1 of the first electrode E1. The LED chip 230 can be, for example, a vertical LED chip. In the present embodiment, the first wire 242 is connected the LED chip 230 to an electrical connecting point C of the second end T2 of the second electrode E2. There is a flat plane between the electrical connecting point C and the LED chip 230.

It should be noticed that the spacer I of the housing 220 of the present invention is coplanar with the first end T1 of the first electrode E1 and the second end T2 of the second electrode E2 (or there is a flat plane between the electrical connecting point C and the LED chip 230) so that the bonding tip can be prevented from hitting the spacer I during the wire bonding process by implementing the present embodiment. Thus, the yield of the bonding process can be improved and the fabricating cost can be decreased.

In other words, in the present embodiment, an orthogonal projection of the first wire 242 on the leadframe 210 does not overlap with an orthogonal projection of the cover layer 224 on the leadframe 210. That is, the orthogonal projection of the first wire 242 on the leadframe 210 is completely within the opening 224a. It should be noticed that since the orthogonal projection of the first wire 242 on the leadframe 210 is completely within the opening 224a, the first wire 242 does not overlap with the cover layer 224. Hence, the bonding tip of the wire bonder (not shown) is not blocked by the cover layer 224 on the wire bonding path during the wire bonding process.

Moreover, the dimension of the surface area of the first end T1 exposed by the opening 224a can be adjusted according to the dimension of the LED chip 230. The dimension of the surface area of the second end T2 exposed by the opening 224a can be adjusted according to the total number of the first wire 242. In the present embodiment, the surface area of the first end T1 of the first electrode E1 exposed by the opening 224a is larger than the surface area of the second end T2 of the second electrode E2 exposed by the opening 224a. Alternatively, in the other embodiment, the surface area of the first end T1 of the first electrode E1 exposed by the opening 224a can be smaller than or equal to the surface area of the second end T2 of the second electrode E2 exposed by the opening 224a.

In order to protect the LED chip 230 and the first wire 242 from being polluted or oxidized by the external environment, a light-transmissive encapsulant 250 can be used to fill the recess 222 and the opening 224a. The light-transmissive encapsulant 250 wraps the LED chip 230 and the first wire 242, and the cover layer 224 is disposed between the leadframe 210 and the light-transmissive encapsulant 250. The material of the light-transmissive encapsulant 250 can be, for example, epoxy resin, silicon, UV-cured glue or other suitable polymer material. Further, the light-transmissive encapsulant 250 may include the fluorescent powders to change the light color provided by the LED chip 230.

It should be noticed that, in the present invention, the cover layer 224 is used to separate the light-transmissive encapsulant 250 from the leadframe 210 to decrease the area of the cemented surface U between the light-transmissive encapsulant 250 and the leadframe 210. Furthermore, the thermal expansion coefficient of the cover layer 224 is similar to that of the light-transmissive encapsulant 250 (i.e. the materials of both of the cover layer 224 and the light-transmissive encapsulant 250 are polymer materials) so that the delamination between the cover layer 224 and the light-transmissive encapsulant 250 due to being heated can be avoided. Thus, the lifetime and the reliability of the LED package structure 200 can be improved.

Figure 3A:
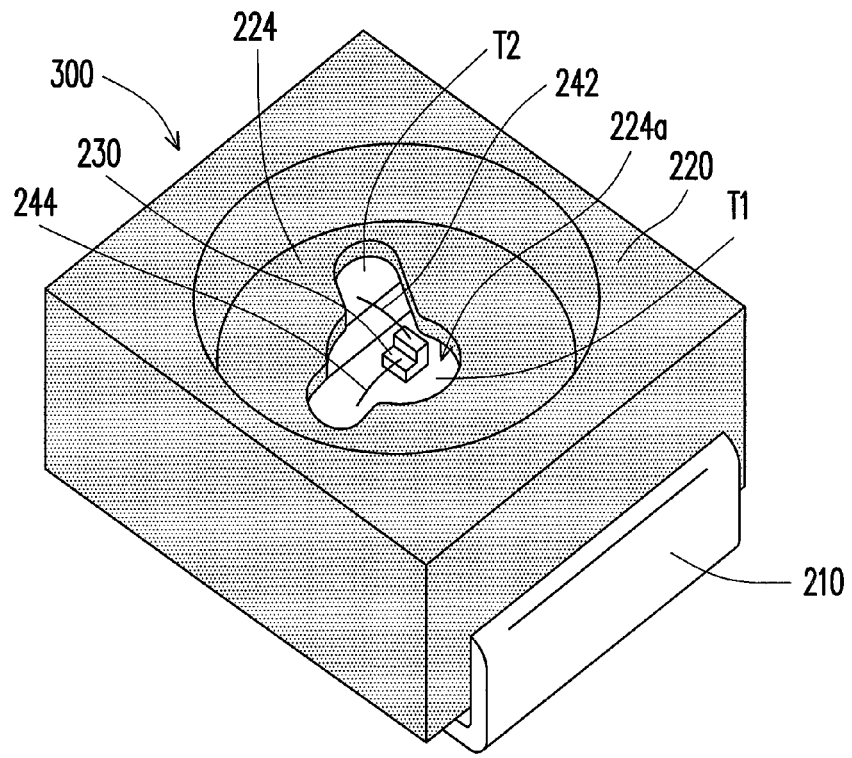
FIG. 3A and FIG. 4A show two variations of the LED package structure in FIG. 2A.
Figure 3B:
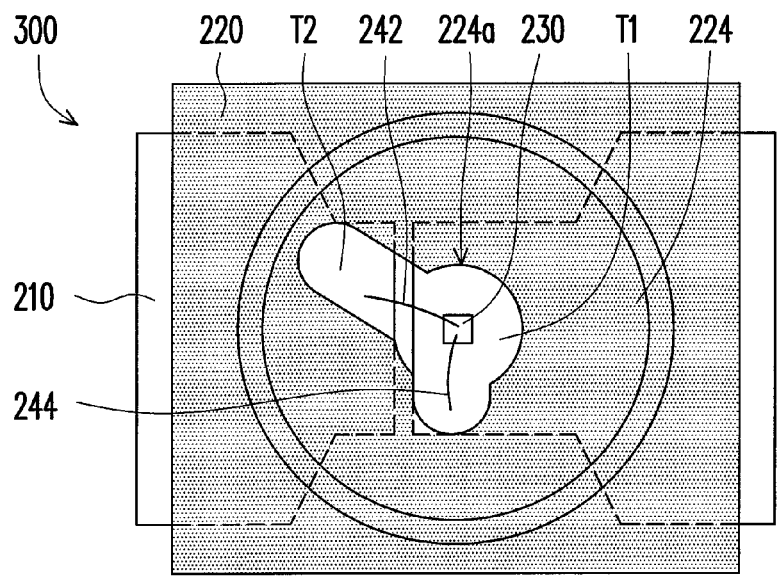
FIG. 3B is a schematic top view of the LED package structure in FIG. 3A.
Figure 4A:
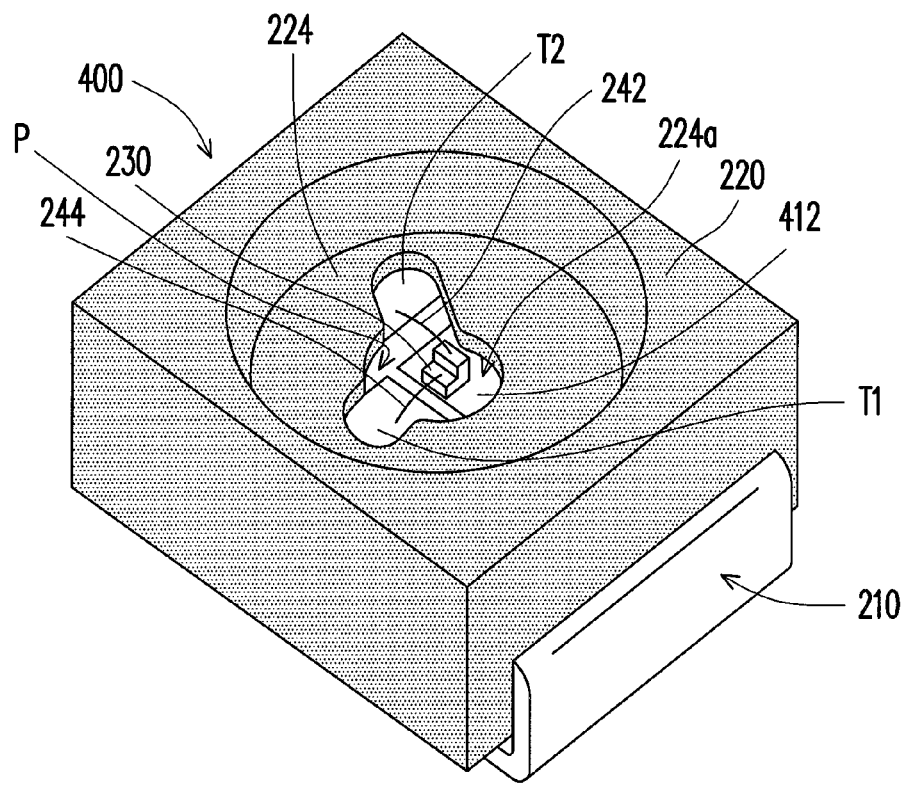
Figure 4B:
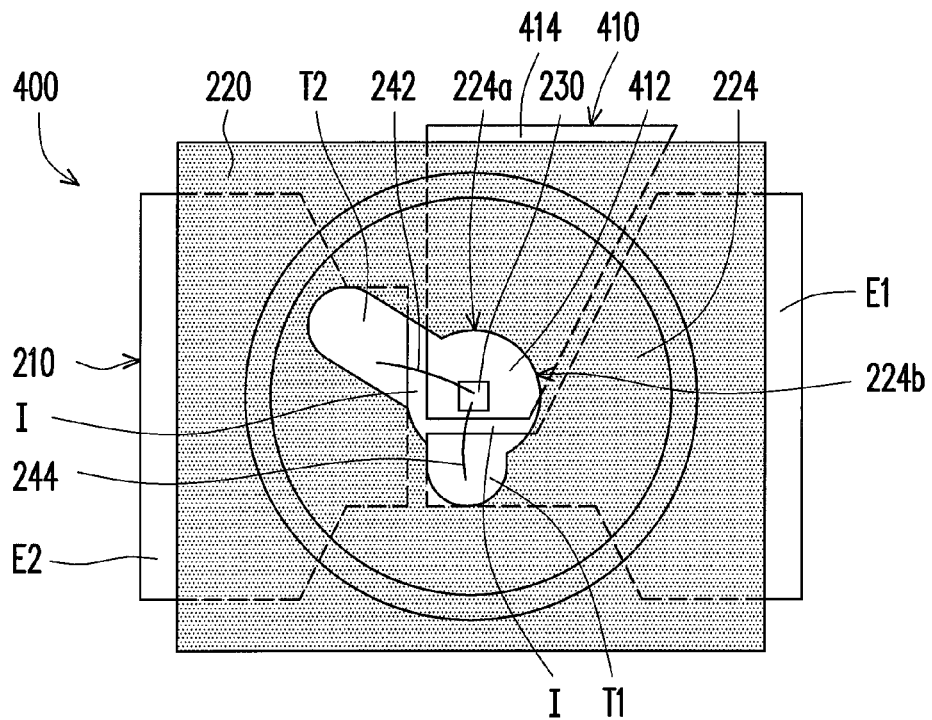
FIG. 4B is a schematic top view of the LED package structure in FIG. 4A.

FIG. 3A and FIG. 4A show two variations of the LED package structure in FIG. 2A, FIG. 3B is a schematic top view of the LED package structure in FIG. 3A, and FIG. 4B is a schematic top view of the LED package structure in FIG. 4A.

As shown in FIG. 3A and FIG. 3B, in the present embodiment, the structure of the LED package structure 300 and the structure of the LED package structure 200 in FIG. 2A are similar to each other and the difference between the LED package structure 300 and the LED package structure 200 is that the LED package structure 300 further comprises a second wire 244. The second wire 224 is connected the first end T1 of the first electrode E1 to the LED chip 230, and the first wire 242 and the second wire 244 are configured at the same side of the LED chip 230, and the LED chip 230 can be, for example, horizontal LED chip.

As shown in FIG. 4A and FIG. 4B, in the present embodiment, the structure of the LED package structure 400 and the structure of the LED package structure 200 in FIG. 2A are similar to each other and the difference between the LED package structure 400 and the LED package structure 200 is that the LED package structure 400 further comprises a heat sink 410. The LED chip 230 is configured on one end 412 of the heat sink 410, and the opening 224a of the cover layer 224 exposes the end 412 of the heat sink 410 and the LED chip 230. The other end 414 of the heat sink 410 outwardly extends from an inner surface of the housing 220 to an outer surface of the housing 220. In the present embodiment, the opening 224a further comprises an extension portion 224b, and the extension portion 224b exposes the end 412 of the heat sink 410 and the LED chip 230 configured on the end 412 of the heat sink 410. In the present embodiment, the flat plane P comprises the end 412 of the heat sink 410, the first end T1 of the first electrode E1, the second end T2 of the second electrode E2 and a plurality of spacers I.

In the present embodiment, the spacers I are configured between the end 412 of the heat sink 410 and the first end T1 of the first electrode E1 and between the end 412 of the heat sink 410 and the second end T2 of the second electrode E2 respectively. In other words, the heat sink 410, the first end T1 of the first electrode E1 and the second end T2 of the second electrode E2 are separated from one another, and the first wire 242 is connected the LED chip 230 to the second end T2 of the second electrode E2, and the second wire 244 is connected to the first end T1 of the first electrode E1 to the LED chip 230. The LED chip 230 can be, for example, a horizontal LED chip.

It should be notice that since the heat sink 410, the first end T1 of the first electrode E1 and the second end T2 of the second electrode E2 are separated from one another, the heat generated by the LED chip 230 while emitting light is only transmitted to the heat sink 410 without affecting the first end T1 of the first electrode E1 and the second end T2 of the second electrode E2. In other words, the LED package structure 400 can be a electro-thermal separation structure.

Altogether, the spacer of the housing of the present invention is coplanar with one end of the first electrode and one end of the second electrode so that the bonding tip can be prevented from hitting the spacer during the wire bonding process. Thus, the yield of the bonding process can be improved and the fabricating cost can be decreased.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A light emitting diode package structure, comprising:
a housing having a first side and a second side opposite the first side, the housing including a recess on the first side thereof, the recess including a bottom and a sidewall;
a leadframe having a first electrode and a second electrode that are accommodated in the housing, wherein:
the first electrode includes a first end of the first electrode disposed on the first side of the housing, a second end of the first electrode disposed on the second side of the housing, and a middle part of the first electrode connecting the first end of the first electrode to the second end of the first electrode,
the second electrode includes a first end of the second electrode disposed on the first side of the housing, a second end of the second electrode disposed on the second side of the housing, and a middle part of the second electrode connecting the first end of the second electrode to the second end of the second electrode,
the first end of the first electrode and the first end of the second electrode are flat and coplanar, the first end of the first electrode and the first end of the second electrode are separated from each other by a spacer which is a part of the housing, the bottom of the recess has a cover layer covering the leadframe that includes an opening that exposes a surface of the first end of the first electrode, a surface of the first end of the second electrode, and a surface of the spacer, and the exposed surface of the first end of the first electrode, the exposed surface of the first end of the second electrode, and the surface of the exposed portion of the spacer are coplanar;

a light emitting diode chip configured in the recess, wherein the light emitting diode chip is electrically connected to the leadframe through the opening in the cover layer; and a light-transmissive encapsulant filling the recess.

2. The light emitting diode package structure of claim 1, wherein the second end of the first electrode and the second end of the second electrode respectively outwardly extend from an inner surface of the housing toward a bottom surface of an outer surface of the housing.

3. The light emitting diode package structure of claim 1, wherein the light emitting diode chip is configured on the first end of the first electrode exposed by the opening.

4. The light emitting diode package structure of claim 1, wherein the light emitting diode chip is electrically connected to the leadframe through a first wire.

5. The light emitting diode package structure of claim 4, wherein the light emitting diode chip is electrically connected to the leadframe through a second wire, and the first wire and the second wire are configured on the same side of the light emitting diode chip.

6. The light emitting diode package structure of claim 1, further comprising a heat sink, wherein a first end of the heat sink is exposed by the opening and the light emitting diode chip is configured on the first end of the heat sink, and a second end of the heat sink outwardly extends from an outer surface of the housing to an inner surface of the housing.

7. The light emitting diode package structure of claim 6, wherein the light emitting diode chip is electrically connected to the leadframe through two wires.

8. The light emitting diode package structure of claim 6, wherein the opening further comprises an extension portion, and the extension portion exposes the first end of the heat sink and the light emitting diode chip configured on the first end of the heat sink.

9. A light emitting diode package structure, comprising:

a housing having a first side and a second side opposite the first side, the housing including a recess on the first side thereof, the recess including a bottom and a sidewall;

a leadframe having a first electrode and a second electrode accommodated in the housing, wherein:

the first electrode includes a first end of the first electrode disposed on the first side of the housing, a second end of the first electrode disposed on the second side of the housing, and a middle part of the first electrode connecting the first end of the first electrode to the second end of the first electrode, the second electrode includes a first end of the second electrode disposed on the first side of the housing, a second end of the second electrode disposed on the second side of the housing, and a middle part of the second electrode connecting the first end of the second electrode to the second end of the second electrode, the first end of the first electrode and the first end of the second electrode are flat and coplanar, the first end of the first electrode and the first end of the second electrode are separated from each other by a spacer which is a part of the housing, and the bottom of the recess has a cover layer covering the leadframe that includes an opening that exposes a surface of the first end of the first electrode, a surface of the first end of the second electrode, and a surface of the spacer; a light emitting diode chip configured in the opening, wherein:

the light emitting diode chip is electrically connected to an electrical connecting point of the second electrode through a first wire, and there is a flat plane, between the electrical connecting point and the light emitting diode chip, composed of the exposed surface of the first end of the first electrode, the exposed surface of the first end of the second electrode, and the surface of the exposed portion of the spacer; and a light-transmissive encapsulant filling the recess, wherein a thermal expansion coefficient of the cover layer is similar to that of the light-transmissive encapsulant.

10. The light emitting diode package structure of claim 9, wherein the second end of the first electrode and the second end of the second electrode respectively outwardly extend from an inner surface of the housing toward a bottom surface of an outer surface of the housing.

11. The light emitting diode package structure of claim 9, wherein the light emitting diode chip is electrically connected to the first end of the first electrode through a second wire.

12. The light emitting diode package structure of claim 9, wherein the flat plane comprises the first end of the first electrode, the first end of the second electrode and at least a spacer.

13. The light emitting diode package structure of claim 12, wherein the spacer is configured between the first end of the first electrode and the first end of the second electrode, and the spacer is connected to the first end of the first electrode and the first end of the second electrode.

14. The light emitting diode package structure of claim 9, further comprising a heat sink, wherein a first end of the heat sink is exposed by the opening and the light emitting diode chip is configured on the first end of the heat sink, and a second end of the heat sink outwardly extends from an inner surface of the housing to an outer surface of the housing.

15. The light emitting diode package structure of claim 14, wherein the light emitting diode chip is electrically connected to an electrical connecting point of the first end of the first electrode and the electrical connecting point of the first end of the second electrode through two wires respectively.

16. The light emitting diode package structure of claim 14, wherein the flat plane comprises the first end of the heat sink, the first end of the first electrode, the first end of the second electrode and a plurality of spacers.

17. The light emitting diode package structure of claim 16, wherein the spacers are configured between the first end of the heat sink and the first end of the first electrode and between the first end of the heat sink and the first end of the second electrode respectively.

* * * * *